// 
US009017091B2

(12) United States Patent
Zhu et al.

(10) Patent No.: US 9,017,091 B2
(45) Date of Patent: Apr. 28, 2015

(54) CABLE ASSEMBLY HAVING POSITIONING STRUCTURE FOR POSITIONING INTERNAL PRINTED CIRCUIT BOARDS

(71) Applicants: Qing-Man Zhu, Kunshan (CN); Chien-Chiung Wang, New Taipei (TW); Jerry Wu, Irvine, CA (US); Kai-Feng Yang, Kunshan (CN)

(72) Inventors: Qing-Man Zhu, Kunshan (CN); Chien-Chiung Wang, New Taipei (TW); Jerry Wu, Irvine, CA (US); Kai-Feng Yang, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 141 days.

(21) Appl. No.: 13/758,145

(22) Filed: Feb. 4, 2013

(65) Prior Publication Data

US 2013/0203293 A1  Aug. 8, 2013

(30) Foreign Application Priority Data

Feb. 13, 2012  (CN) .......................... 201210031133.6

(51) Int. Cl.
*H01R 13/627* (2006.01)
*H01R 13/512* (2006.01)
*H01R 13/6586* (2011.01)
*H01R 24/60* (2011.01)
*H01R 13/58* (2006.01)
*H05K 1/14* (2006.01)

(52) U.S. Cl.
CPC .............. *H01R 13/512* (2013.01); *H01R 13/58* (2013.01); *H01R 13/6275* (2013.01); *H01R 13/6586* (2013.01); *H01R 24/60* (2013.01); *H05K 1/144* (2013.01); *H05K 2201/042* (2013.01)

(58) Field of Classification Search
USPC .................... 439/352, 350, 76.1, 660, 607.46
See application file for complete search history.

(56) References Cited

U.S. PATENT DOCUMENTS

| | | | |
|---|---|---|---|
| 7,114,980 B1 | 10/2006 | Wu | |
| 7,238,040 B1* | 7/2007 | Wu | 439/352 |
| 7,413,473 B2 | 8/2008 | Wu | |
| 7,445,484 B2* | 11/2008 | Wu | 439/352 |
| 7,651,342 B1 | 1/2010 | Wu | |
| 7,938,669 B2 | 5/2011 | Li et al. | |
| 8,267,713 B2* | 9/2012 | Wu | 439/352 |
| 8,475,198 B2* | 7/2013 | Wu | 439/352 |
| 8,708,752 B2* | 4/2014 | Wu | 439/660 |
| 2004/0198079 A1* | 10/2004 | Aronson et al. | 439/76.1 |

FOREIGN PATENT DOCUMENTS

| | | |
|---|---|---|
| CN | 2909584 Y | 6/2007 |
| CN | 2916961 Y | 6/2007 |
| CN | 200990440 Y | 12/2007 |
| CN | 101173684 A | 5/2008 |

(Continued)

*Primary Examiner* — Hae Moon Hyeon
(74) *Attorney, Agent, or Firm* — Ming Chieh Chang; Wei Te Chung

(57) ABSTRACT

A cable assembly comprises a housing including an upper cover and a lower cover assembled with each other and a pair of first and second printed circuit boards (PCBs) received in the housing and sandwiched between the upper and lower cover. The upper cover defines a number of protruding portions formed therein. Each of the protruding portion defines two steps thereon. The first and second PCBs are spaced apart from each other along a vertical direction by the two steps of each of the protruding portions. The first and second PCBs respectively define a plurality of first and second openings cooperating with corresponding protruding portions.

20 Claims, 8 Drawing Sheets

(56) References Cited

FOREIGN PATENT DOCUMENTS

| CN | 101552401 A | 10/2009 |
| CN | 201438574 U | 4/2010 |
| CN | 201868678 U | 6/2011 |
| CN | 201887197 U | 6/2011 |
| CN | 201927841 U | 8/2011 |
| CN | 103247915 A | 8/2013 |

* cited by examiner

CABLE ASSEMBLY HAVING POSITIONING STRUCTURE FOR POSITIONING INTERNAL PRINTED CIRCUIT BOARDS

FIELD OF THE INVENTION

The present invention generally relates to a cable assembly, and more particularly to a cable assembly with positioning structure for positioning internal printed circuit boards (PCBs).

DESCRIPTION OF PRIOR ART

PCI Express (Peripheral Component Interconnect Express), officially abbreviated as PCI-E or PCIe, is a computer expansion card interface format introduced by Intel in 2004. It was designed to replace the general-purpose PCI expansion bus, the high-end PCI-X bus, and the AGP (Accelerated Graphic Ports) graphics card interface. Unlike previous PCI expansion interfaces, rather than being merely a bus, it is configured around point-to-point full duplex serial links called lanes. In PCIe 1.1 (the most common version as of 2007) each lane carries 250 MB/s in each direction.

PCI Express External Cabling which extends the PCI Express interconnects architecture "outside the box." Cables using the PCIe technology will be used for external applications, as well as applications internal to an enclosure that needs a cable connection. PCI Express External Cabling Specification, REV. 1.0 introduced four kinds of cable assemblies x1, x4, x8, and x16, among which the x16 cable assembly may reach highest transmitting rate. The x16 cable assembly includes a housing, a pair of stacked PCBs accommodated in a space of the housing and four cables terminated to corresponding PCBs. For example, U.S. Pat. No. 7,938,669 issued to Li et al. discloses a x16 cable assembly, the cable assembly comprising a housing having an upper first shield part and a lower second shield part together forming a receiving space therein, a pair of PCBs received in the receiving space, a spacer interposed between the pair of PCBs, four cables coupled to the pair of PCBs, and a latching mechanism assembled to an exterior surface of the housing. The spacer defines a grounding piece formed therein and inserted into the pair of PCBs to achieve a grounding function. However, the pair of PCBs formed in the housing is positioned in the housing by the spacer. As a result, the cost of the cable assembly is high and the assembling process of cable assembly is complex.

Hence, an improved cable assembly is desired to overcome the aforementioned disadvantage.

SUMMARY OF THE INVENTION

Accordingly, an object of the present invention is to provide a cable assembly having simple positioning structure for positioning printed circuit board formed therein and having less component to reduce manufacture cost thereof.

In order to achieve the object set forth, a cable assembly comprises a housing comprising an upper cover and a lower cover assembled with each other. And the upper cover defining a plurality of protruding portions formed therein, each of the protruding portion defining two steps formed thereon. And a pair of first and second PCBs received in the housing and sandwiched between the upper and lower cover, the first and second PCBs spaced apart with each other along vertical direction by two steps of each of the protruding portion, the first and second PCBs respectively defining a plurality of first and second openings cooperated with the corresponding protruding portions.

Other objects, advantages and novel features of the invention will become more apparent from the following detailed description when taken in conjunction with the accompanying drawings.

DETAILED DESCRIPTION OF PREFERRED EMBODIMENTS

Figure 1:
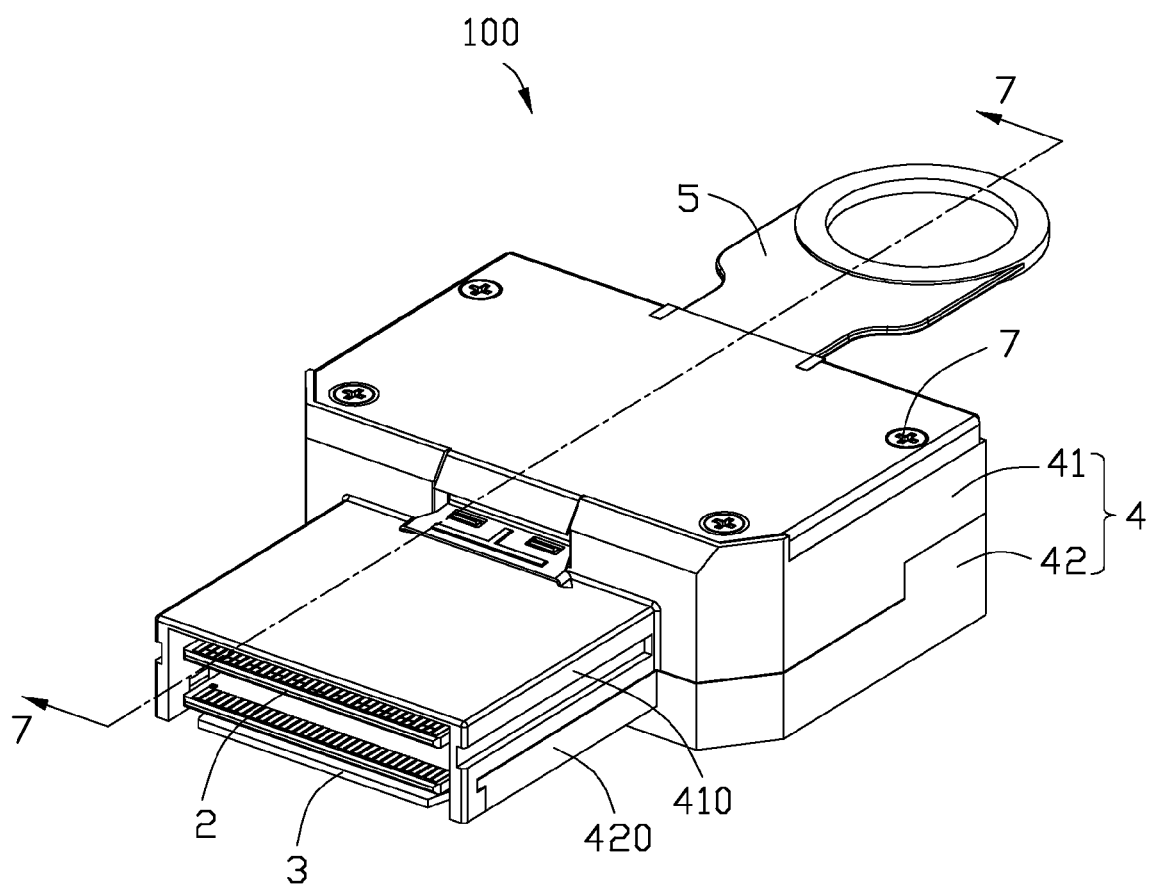
FIG. 1 is an assembled, perspective view of a cable assembly in accordance with the present invention.

Reference will now be made in detail to the preferred embodiment of the present invention.

Referring to FIGS. 1 to 7, a cable assembly in accordance with the present invention comprises a metallic housing 4 defining a receiving space therein, a pair of first and second PCBs 2, 3 received in the receiving space, a metallic piece 8 formed between the pair of PCBs 2, 3 and engaged with the metallic housing 4, and a latching mechanism 5 assembled to the metallic housing 4. The metallic housing 4 comprises an upper cover 41 and a lower cover 42 assembled with each other.

Figure 8:
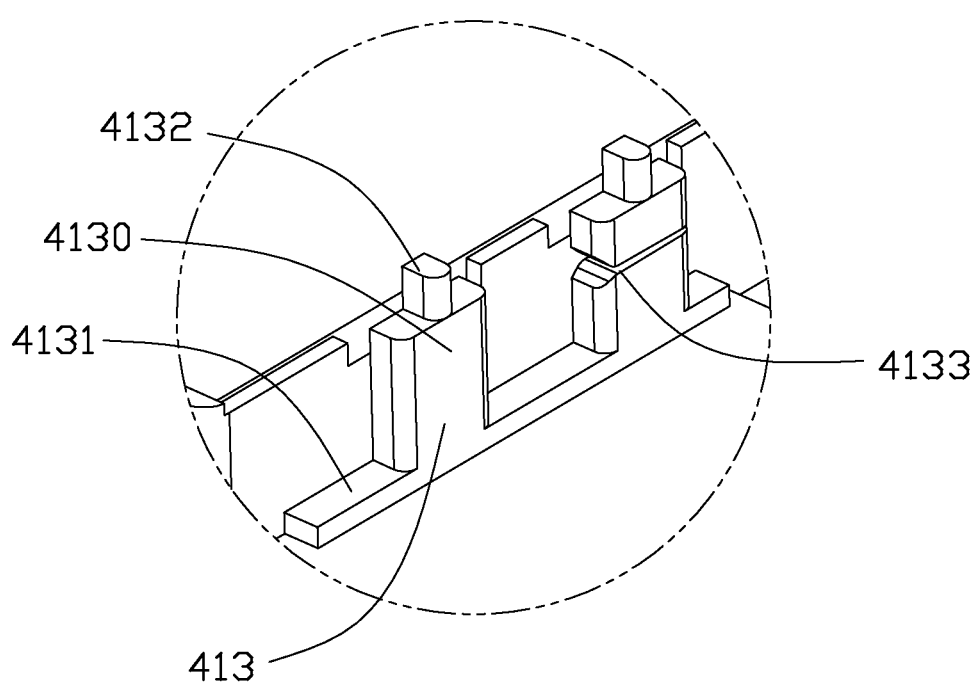
FIG. 8 is a partial enlarged view of FIG. 3.

Referring to FIGS. 1 to 4 and in conjunction with FIG. 8, the upper cover 41 comprises an expanded first base portion 410 and a relative slim first mating portion 411 extending forwardly from a front edge of the first base portion 410. The first base portion 410 has a top wall 4105, a pair of side walls 4103 and a rear wall 4102. Four semicircular through holes 4104 are defined in the rear wall 4105 and arranged in a row along transversal direction. The first base portion 410 defines four through holes 4101 formed at four corners thereof and extending along a vertical direction. The top wall 4105 defines a channel 4120 formed on a top surface 412 and extending along a longitudinal direction, and two pairs of grooves 4122, 4123 communicated with the channel 4120 and extending along a transversal direction. A receiving cavity 4121 is recessed downwardly from the top surface 412 of the top wall 4105 and communicated with the channel 4120. The receiving cavity 4121 is defined in front of the channel 4120 and deeper than the channel 4120. The first mating portion 411 has a top side 4113 and a pair of lateral sides 4114 extending downward from two edges of the top side 4113. The pair of lateral sides 4114 respectively defines two protruding portions 413 formed on an inner surface thereof and extending to a bottom surface of the top side 4113. Each of the protruding portions 413 defines two steps formed on two opposite front and rear ends thereof. Each of the protruding portions 413 defines a first section 4131, a second section 4130, and a third section 4132 stacked with each other along a vertical direction. The first section 4131 is wider than the second section 4130. The second section 4130 is wider than the third section 4132. Two first sections 4131 of two protruding portions 413 formed on a lateral side are connected with each other along a front to rear direction. Two protruding portions 413 formed at two lateral sides respectively define a slit 4133 extending along a longitudinal direction.

Referring to FIGS. 1 to 4 and in conjunction with FIG. 8, the lower cover 42 comprises a second base portion 420 and a second mating portion 421 extending forwardly from a front edge of the second base portion 420. The second base portion 420 has a bottom wall 4201, a pair of side walls 4203 and a rear wall 4202 extending upwardly from lateral edges and rear edge of the bottom wall 4201. Four semicircular through holes 4204 are formed in the rear wall 4202 and extending along a front to rear direction. The four semicircular through holes 4204 are arranged in a row along transversal direction. The second base portion 420 respectively defines four screw holes 4206 formed at four corners and in alignment with the through holes 4101 of the upper cover 41. The second mating portion 421 has a bottom side 4211 and a pair of flanges 4212 extending upward from two lateral edges of the bottom side 4211. A plurality of supporting ribs 4213 are respectively arranged at two lateral sides of the bottom side 4211. The lower cover 42 defines a first pair of positioning posts 4205 formed in the second base portion 420 and respectively disposed at the two sides of the second base portion 420. The lower cover 42 further defines a second pair of positioning posts 4210 formed in the second mating portion 421 and respectively disposed at the two sides of the second mating portion 421.

Referring to FIGS. 1 to 7, the pair of PCBs are disposed in the receiving space of the metallic housing 4 and comprises a first PCB 2 and a second PCB 3. The first and second PCBs 2, 3 respectively defines a mating portion 21, 31 with a plurality of conductive pads formed thereon, and a terminating portion 22, 32 opposite to the mating portion 21, 31 and with a plurality of conductive pads for terminating to the cable (not shown). The first PCB 2 defines two first openings 23 formed on a lateral side and another two first openings 23 formed on another lateral side. Each of two first openings 23 are arranged along a longitudinal direction and spaced apart from each other. The second PCB 2 defines two second openings 33 formed on a lateral side and another two second openings 33 formed on another lateral side. Each of two second openings 33 are arranged along a longitudinal direction and spaced apart from each other. Each of the first opening 23 is larger than the second opening 33.

Figure 2:
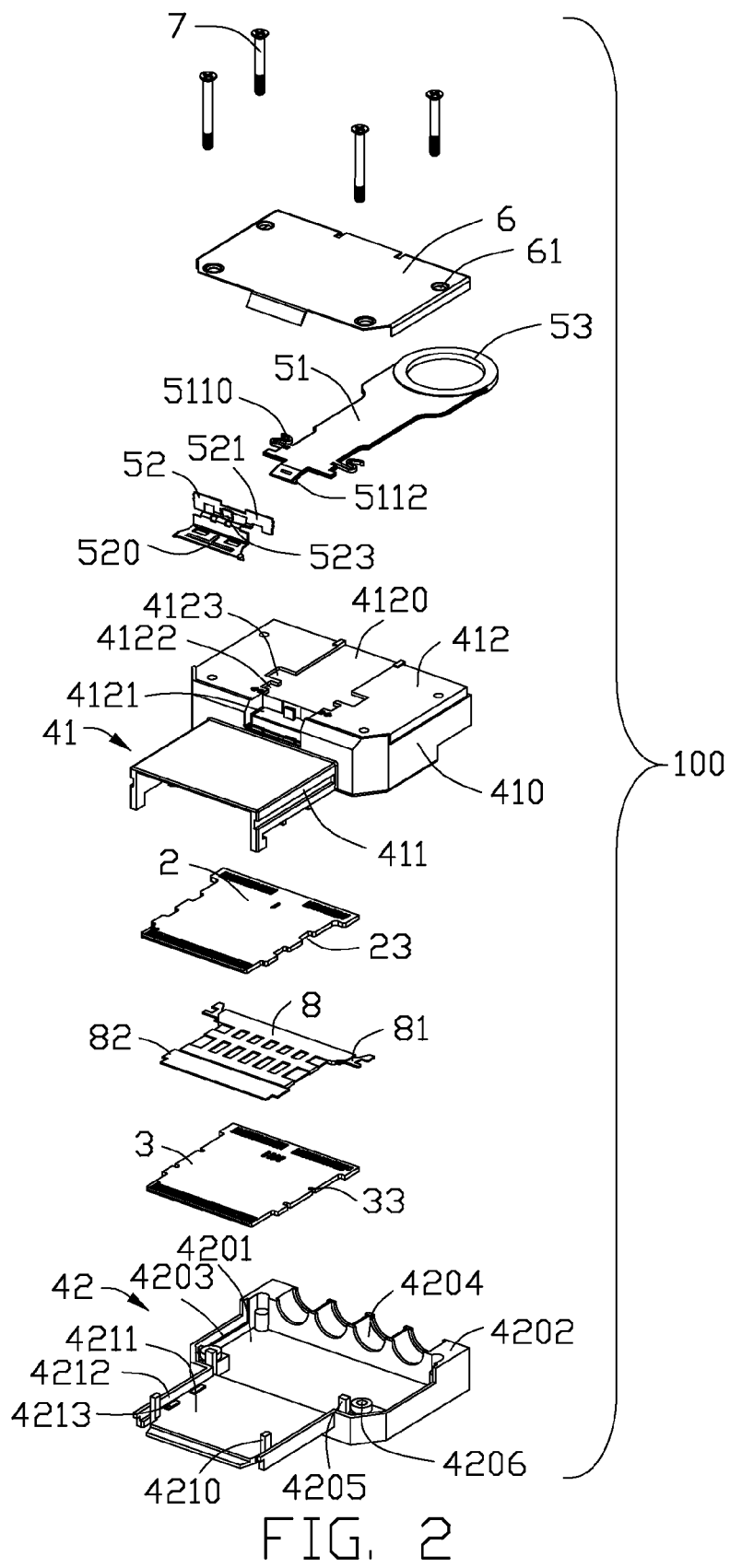
FIG. 2 is an exploded, perspective view of FIG. 1.
Figure 3:
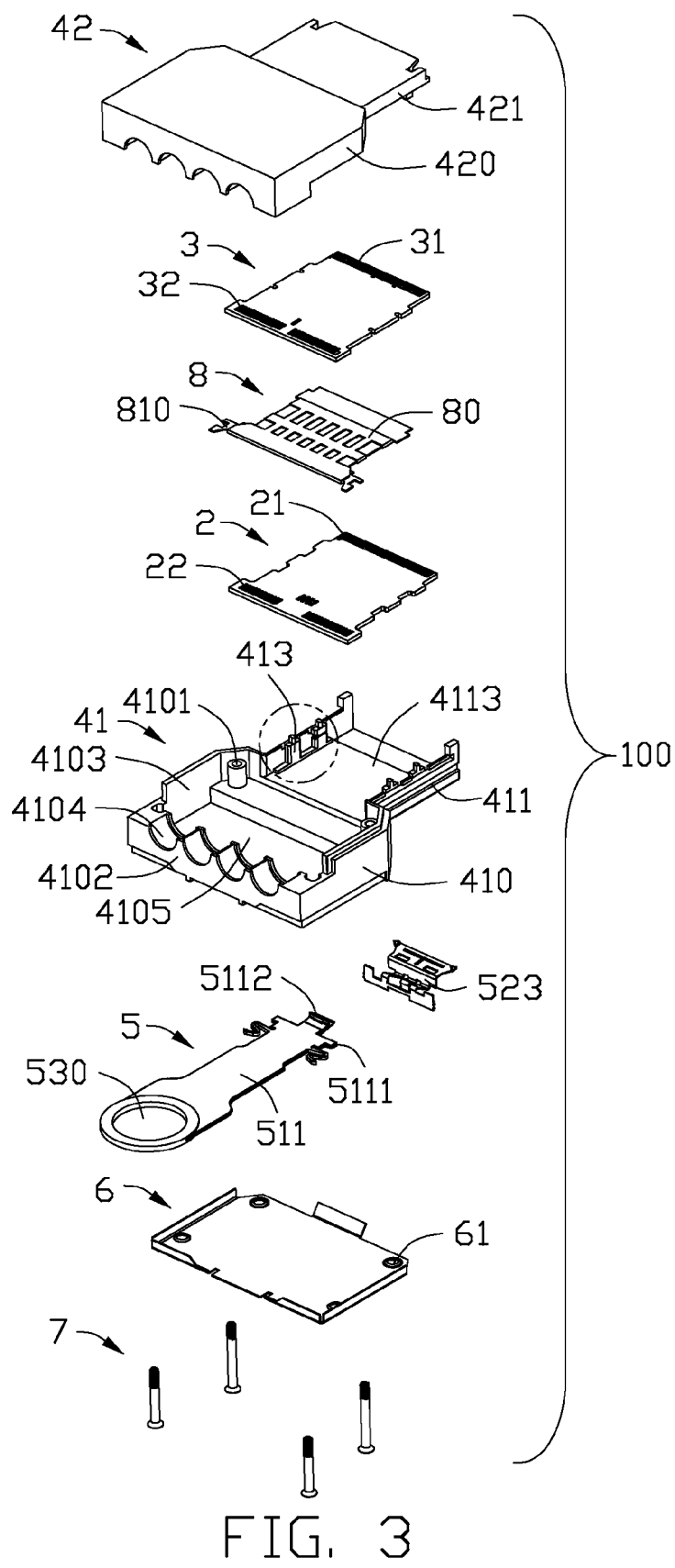
FIG. 3 is similar to the FIG. 2, but view from another aspect.
Figure 4:
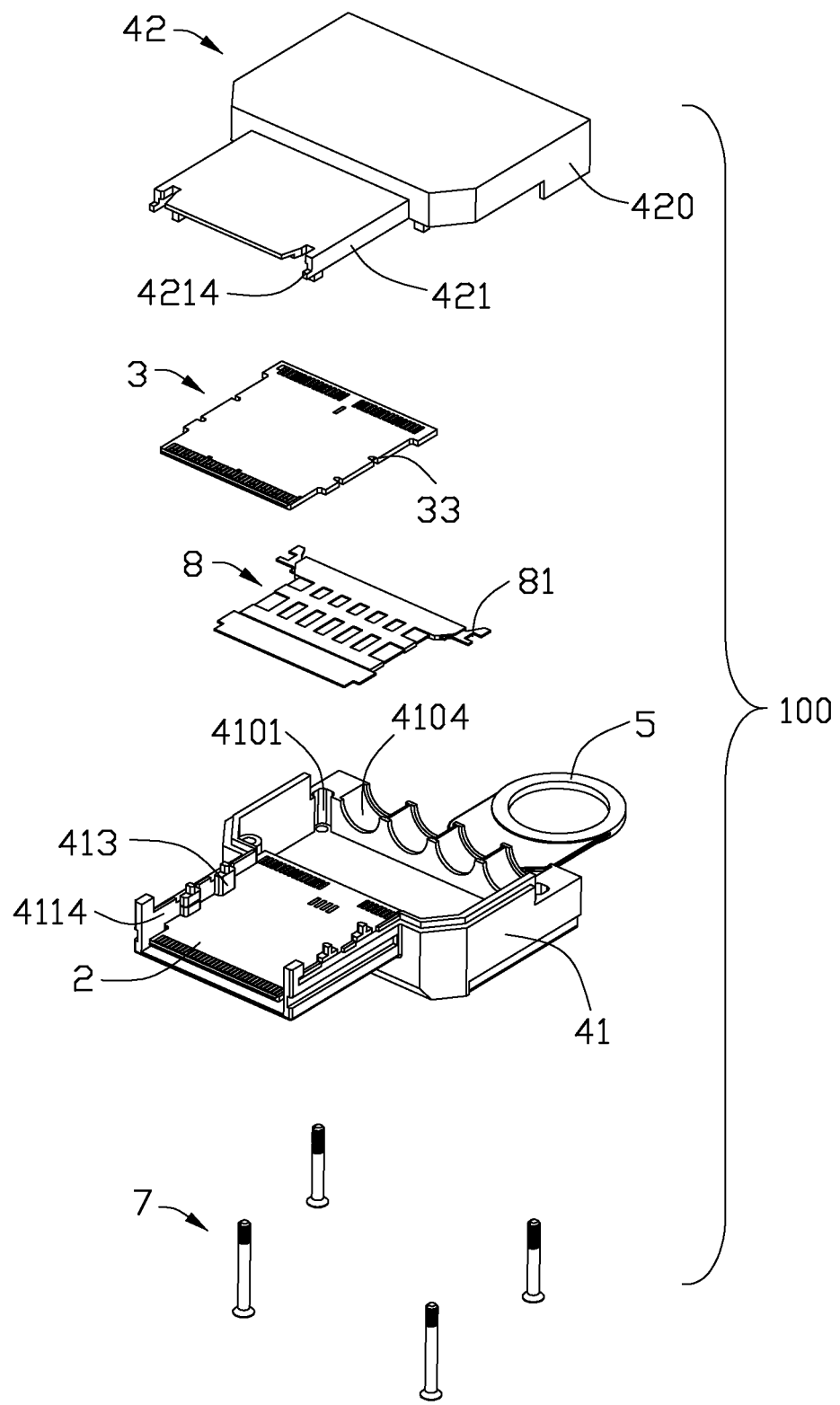
FIG. 4 is a partial assembled, perspective view of the cable assembly with a first PCB assembled to an upper cover.
Figure 5:
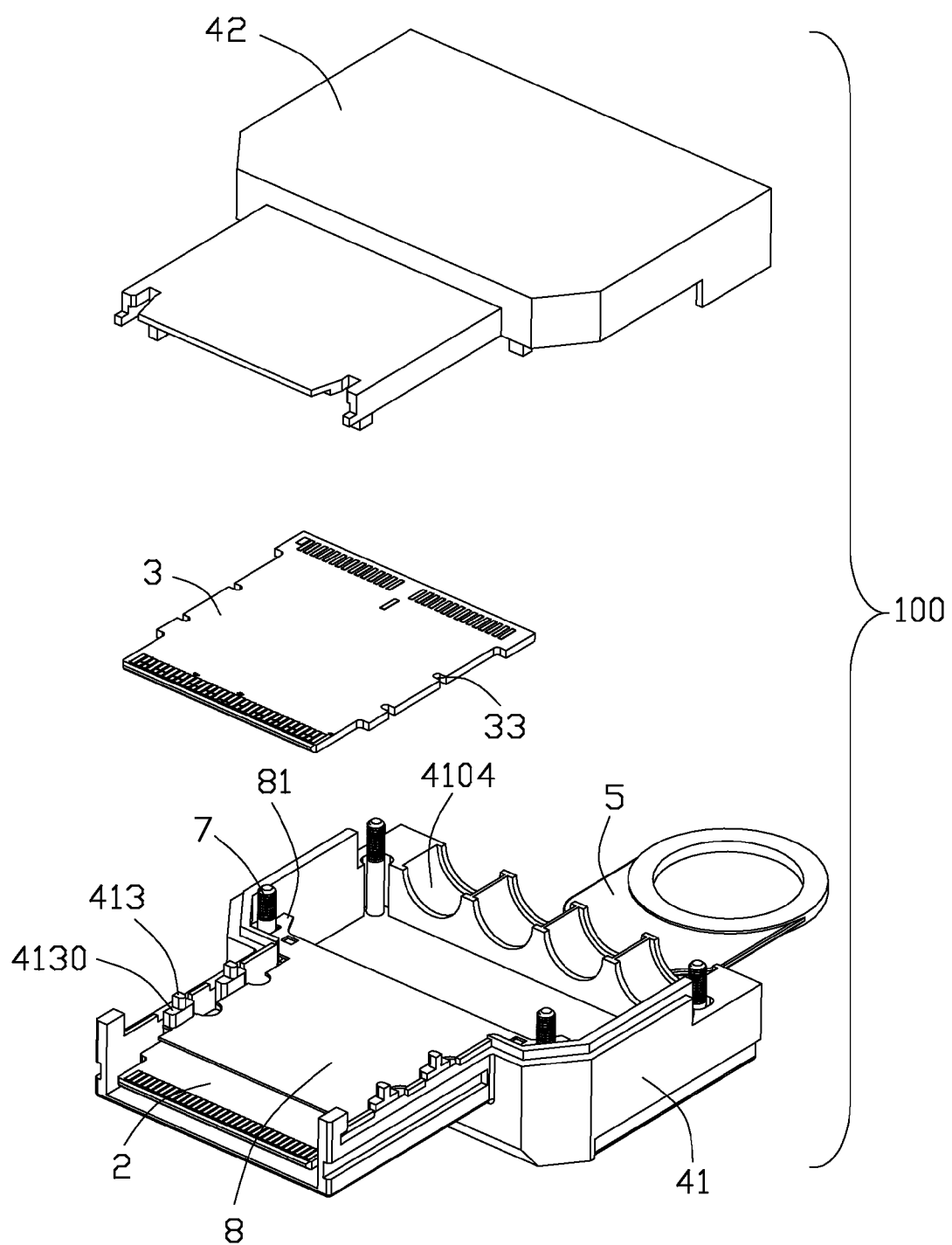
FIG. 5 is a partial assembled, perspective view of the cable assembly of FIG. 4 with a metallic piece assembled to an upper cover.
Figure 6:
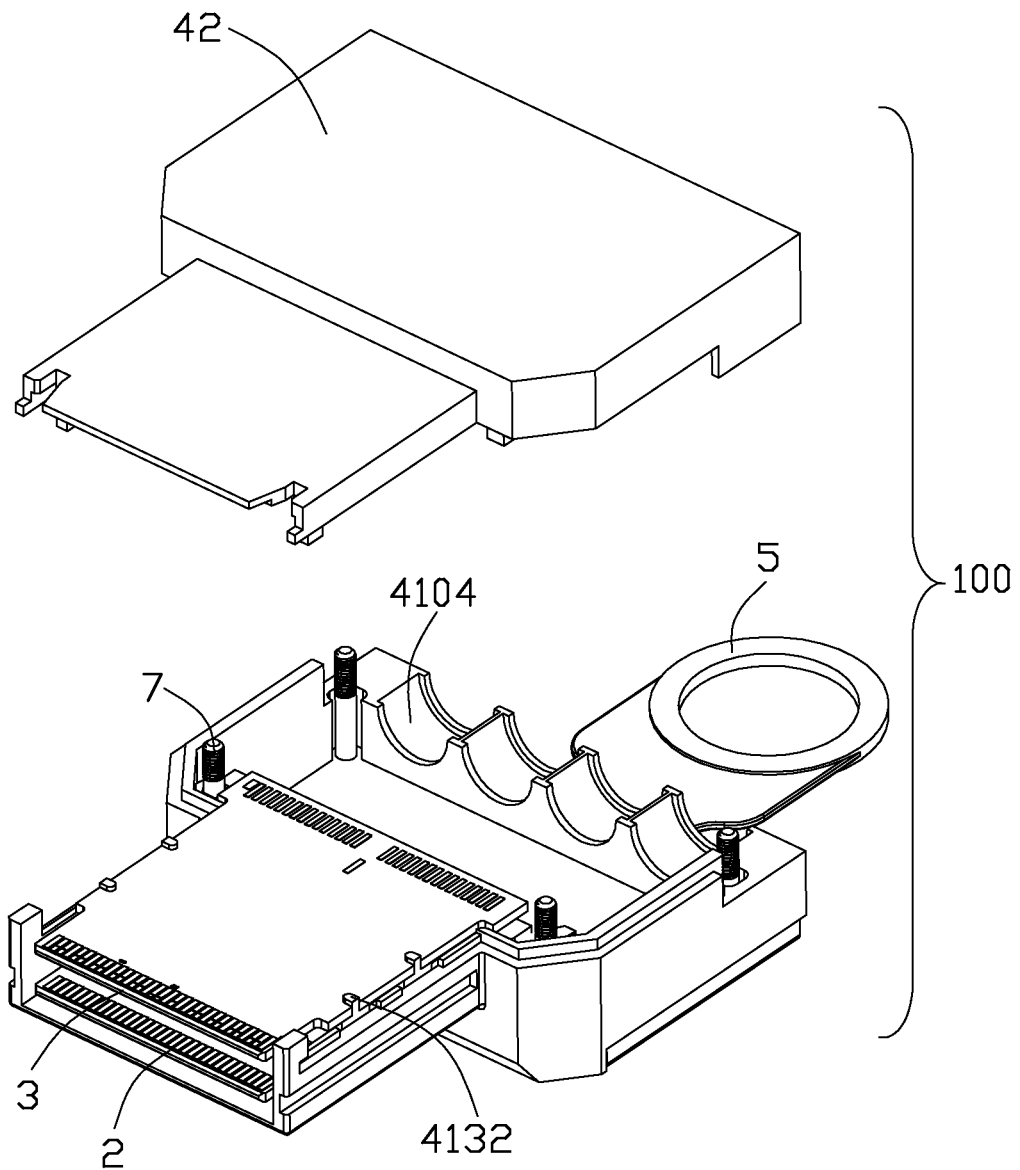
FIG. 6 is a partially assembled, perspective view of the cable assembly of FIG. 5 with a second PCB assembled to the upper cover.
Figure 7:
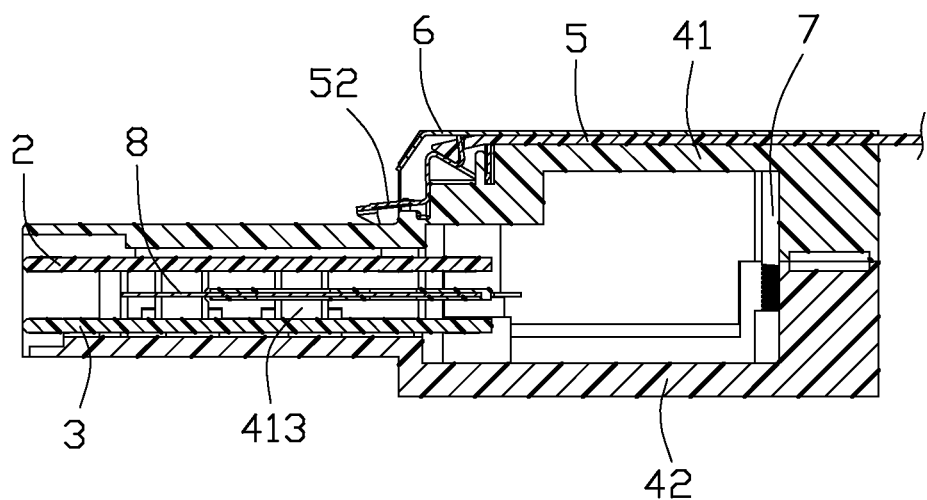
FIG. 7 is a cross-section view of the cable assembly of FIG. 1 taken along line 7-7.

Referring to FIGS. 1 to 3 and in conjunction with FIG. 7, the latching mechanism 5 is assembled to a top surface of the metallic housing 4 of the cable assembly 100. The latching mechanism 5 comprises a latching member 52, a pulling member 51 cooperated with the latching member 52, and a pulling tape 53 attached to a rear portion of the pulling member 51. The pulling member 51 has a main body 511 which can be received into the channel 4120, a pair of claw-shaped spring members 5110 arranged at lateral sides of a front segment of the main body 511 and received in the grooves 4123. The pulling member 51 further defines a pair of stoppers 5111 disposed in front of the pair of claw-shaped spring members 5110 and arranged at the lateral sides of the main body 511 and received in the receiving groove 4122, and a cooperating portion 5112 formed at a front end thereof. The latching member 52 is received into the receiving cavity 4121 and comprises a front latching section 520 for latching with a complementary connector, a rear engaging section 521 engaged with the metallic housing 4, and a middle connecting section 523 connected with the latching section 520 and the engaging section 521 for cooperating with the cooperating portion 5112.

Referring to FIGS. 1 to 3, the cable assembly 100 further comprises a conductive shell 6 assembled to the top surface 412 of the upper cover 41 and shielding the upper surface 412 and a portion of the latching mechanism 5. The conductive shell 6 defines four circular holes 61 corresponding to the four through holes 4101 and four screw holes 4206.

Referring to FIGS. 2 to 6, the cable assembly 100 further comprises a metallic piece 8 located between the first PCB 2 and the second PCB 3. The metallic piece 8 defines a pair of inserting portions 82 formed at two sides of a front section thereof and a pair of clamping arms 81 formed on two lateral sides of the rear section thereof. Each of the clamping arms 81 defines a cutout 810. The middle section and the rear section of the metallic piece 8 are covered a layer of plastic to enhance the strength of the metallic piece 8 and prevent the short circuit of the PCB and the wires. The cable assembly 100 further comprises four screws 7 respectively passing through the four circular holes 61, four through holes 4101 and received into the four screw holes 4206. Thus, the metallic shell 6, the upper cover 41 and the lower cover 42 are engaged with each other by the four screws 7. It should be noted that the pair of clamping arms 81 of metallic piece 8 are also engaged to the metallic housing 4 by the two screws 7.

The assembling process of the cable assembly 100 made in according to the present invention starts from assembling the first PCB 2 to the upper cover 42. The first PCB 2 is supported by the four first sections 4131 of the four protruding portion 413, and the four second sections 4130 of the protruding portions 413 are respectively accommodated into the four first openings 23 of the first PCB 2. Thus, a movement of the first PCB 2 is restricted by the second sections 4130 along longitudinal direction.

Secondly, the metallic piece 8 is assembled in the upper cover 41, and spaced apart and parallel to the first PCB 2. The inserting portions 82 are respectively inserted into the two slits 4133 of the two protruding portions 413. Thus, the front section of the metallic piece 8 is positioned to the housing 4.

Thirdly, the second PCB 3 is assembled to the upper cover 41, and spaced apart and parallel to the metallic piece 8. The four third sections 4132 of the four protruding portions 413 inserted into the second openings 33 of the second PCB 3. And the second PCB 3 is supported by the four second sections 4130 of the four protruding portions 413. Thus, the movement of the second PCB 3 is restricted along a longitudinal direction.

Fourthly, the lower cover 42 is assembled to the upper cover 41. Thus, the pair of first positioning posts 4210 are passed through two sides of the metallic piece 8 and the second PCB 3 and supported to the front section of the first PCB 2. And the pair of the second positioning posts 4205 are also passed through two sides of the metallic piece 8 and the second PCB 3, and supported to the rear section of the first PCB 2. The second PCB 3 is supported by the supporting ribs 4213 of the lower cover 42. Thus, the movement of vertical direction of the first PCB 2 and the second PCB 3 is restricted. The first and second PCBs 2 and 3 are sandwiched between the upper and the lower covers 41 and 42.

Fifthly, the latching mechanism 5 is assembled to the top surface 412 of the upper cover 41. The latching member 52 is received into receiving cavity 4121 of the upper cover 41. The pulling member 51 is received into the channel 4120 and connected with the pulling tap 53. The pulling tap 53 is attached to a rear end of the pulling member 52. Pulling the pulling tape 53 back, the pulling tape 53 will drive the pulling member 51 backwardly. And the latching member 52 is raised up by the pulling member 51.

Finally, The conductive shell 6 is assembled to the first top surface of the upper cover 41, and then the four screws 62 are assembled to the cable assembly 100. The four screws 62 passed through the screw holes 61, 4101, 4206 to interconnect with the conductive shell 6, the upper and the lower cover 41, 42. In additional, a pair of screws 62 may pass through the cutout 810 of the clamping arms 81 of the metallic piece 80. Thus, the rear portion of the metallic piece 8 is positioned to the housing 4 by a pair of screws.

After the above assembling steps, the entire process of assembling the cable assembly 100 is finished. The cable assembly 100 defines four protruding portions 413 formed on an inner surface of the upper cover 41 to position the two PCBs 2 and 3. Thus, the cable assembly 100 has simple positioning structure and less component to reduce manufacture cost. In additional, the cable assembly 100 also defines a metallic piece 8 assembled between the two PCBs 2 and 3. Thus, the crosstalk between the two PCBs 2 and 3 will be reduced.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A cable assembly comprising:
a housing comprising an upper cover and a lower cover assembled with each other, the upper cover defining a plurality of protruding portions formed therein, each of the protruding portions defining two steps thereon; and
a first and second printed circuit boards (PCBs) received in the housing and sandwiched between the upper and lower cover, the first and second PCBs spaced apart from each other along a vertical direction by the two steps of each protruding portion, the first and second PCBs respectively defining a plurality of first and second openings cooperating with the corresponding protruding portions.

2. The cable assembly as recited in claim 1, wherein each protruding portion comprises a first section, a second section and a third section stacked with each other along the vertical direction, the first opening cooperates with the second section, and the second opening cooperates with the third section.

3. The cable assembly as recited in claim 2, wherein the first opening is larger than the second opening, and the second section is wider than the third section.

4. The cable assembly as recited in claim 1, further comprising a metallic piece engaged with the housing and located between the first and second PCBs.

5. The cable assembly as recited in claim 4, wherein two of the plurality of protruding portions respectively has a slit therein, and the metallic piece defines two front inserting portions inserted into the slits.

6. The cable assembly as recited in claim 5, further comprising a plurality of screws interconnected with the upper cover and the lower cover, and wherein the metallic piece has a pair of clamping arms engaged to the housing by the plurality of screws.

7. The cable assembly as recited in claim 6, further comprising a latching mechanism assembled to a top surface of the upper cover and a conductive shell shielding a portion of the latching mechanism.

8. The cable assembly as recited in claim 6, wherein each of the clamping arms defines a cutout, and two of the screws respectively pass through the cutouts.

9. The cable assembly as recited in claim 4, wherein the lower cover defines a pair of first positioning posts and a pair of second positioning posts respectively passing through the two sides of the metallic piece and the second PCB and supporting the first PCB.

10. The cable assembly as recited in claim 9, further comprising a plurality of fasteners interconnecting the upper cover and the lower cover, and wherein the metallic piece has a pair of clamping arms formed on a rear portion thereof passed through by two of the plurality of fasteners and clamped by the upper and lower covers.

11. The cable assembly as recited in claim 9, wherein the plurality of protruding portions define two steps for supporting and spacing apart the pair of PCBs in the vertical direction, and the pair of PCBs respectively define a plurality of openings cooperating with the protruding portions.

12. The cable assembly as recited in claim 9, further comprising a latching mechanism assembled to a top surface of the upper cover and a conductive shell shielding a portion of the latching mechanism.

13. A cable assembly comprising:
a metallic housing comprising an upper cover and a lower cover assembled with each other, the metallic housing defining a plurality of protruding portions formed therein;
a pair of printed circuit boards (PCBs) sandwiched between the upper cover and the lower cover and spaced apart from each other along a vertical direction; and
a metallic piece received into the metallic housing and located between the pair of PCBs, the metallic piece having two inserting portions inserting into two of the plurality of protruding portions.

14. A cable connector assembly comprising:
a housing including a first cover and a second cover assembled to each other in a vertical direction and commonly defining a receiving space therein;
one of said first and second covers defining a plurality of protruding portions on an interior thereof, each of said protruding portions defining a telescopic stepped structure with a first section, a second section, and a third section; and
first and second printed circuit boards commonly received in the receiving space while being spaced from each other in the vertical direction; wherein
the first printed circuit board is supported upon the first section, and the second printed circuit board is supported upon the second section.

15. The cable connector assembly as claimed in claim 14, wherein the second section is beside the first section and the third section is beside the second section, and the first printed circuit board defines a plurality of first openings each receiving said second section, and the second printed circuit board defines a plurality of second openings each receiving said third section.

16. The cable connector assembly as claimed in claim 15, wherein the second section is larger than the third section in a cross-section, and is farther from an assembling position than the third section so that it is the first printed circuit board is firstly assembled into the receiving space before the second printed circuit board.

17. The cable connector assembly as claimed in claim 15, wherein the protruding portions are formed on two opposite sides of said one of the first cover and the second cover, and the first openings are formed in two opposite sides of the first printed circuit board and the second openings are formed in two opposite sides of the second printed circuit board.

18. The cable connector assembly as claimed in claim 15, wherein said first printed circuit board defines a contour different from that of the second printed circuit board.

19. The cable connector assembly as claimed in claim 14, wherein at least one of said protruding portions defines a retention structure to retain a metallic plate between the first printed circuit boar and the second printed circuit board.

20. The cable connector assembly as claimed in claim 19, wherein said retention structure is a horizontal slot so that the metallic plate is required to be assembled to said one of the first cover and the second cover in a horizontal direction perpendicular to said vertical direction.

\* \* \* \* \*